United States Patent
Hatanpaa et al.

(10) Patent No.: US 7,713,584 B2
(45) Date of Patent: May 11, 2010

(54) PROCESS FOR PRODUCING OXIDE FILMS

(75) Inventors: Timo Hatanpaa, Espoo (FI); Marko Vehkamaki, Helsinki (FI); Mikko Ritala, Espoo (FI); Markku Leskela, Espoo (FI)

(73) Assignee: ASM International N.V., Almere (NL)

( * ) Notice: Subject to any disclaimer, the term of this patent is extended or adjusted under 35 U.S.C. 154(b) by 1048 days.

(21) Appl. No.: 11/318,092

(22) Filed: Dec. 22, 2005

(65) Prior Publication Data
US 2007/0148347 A1    Jun. 28, 2007

(51) Int. Cl.
C23C 16/06 (2006.01)

(52) U.S. Cl. .......................... 427/255.32; 427/255.31; 427/255.29; 427/255.28; 427/255.23; 427/255.19; 427/248.1; 556/76; 556/80

(58) Field of Classification Search .................. None
See application file for complete search history.

(56) References Cited

U.S. PATENT DOCUMENTS

| | | | |
|---|---|---|---|
| 4,058,430 A | 11/1977 | Suntola et al. | |
| 5,276,010 A | 1/1994 | Sasaki | |
| 5,711,811 A | 1/1998 | Suntola et al. | |
| 5,902,639 A | 5/1999 | Glassman et al. | |
| 6,110,531 A * | 8/2000 | Paz de Araujo et al. | . 427/255.25 |
| 6,177,135 B1 | 1/2001 | Hintermaier et al. | |
| 6,632,279 B1 * | 10/2003 | Ritala et al. .................. | 117/101 |
| 2003/0124875 A1 | 7/2003 | Kil | |
| 2004/0028811 A1 | 2/2004 | Cho et al. | |
| 2005/0089632 A1 | 4/2005 | Vehkamaki et al. | |

FOREIGN PATENT DOCUMENTS

WO    WO 02/27063 A2    4/2002

OTHER PUBLICATIONS

Noguchi et al., Japanese Journal of Applied Physics, vol. 35 (1996), pp. 4900-4904.*
Cho et al., "Atomic Layer Deposition (ALD) of Bismuth Titanium Oxide Thin Films Using Direct Liquid Injection (DLI) Method," *Integrated Ferroelectrics* 59: 1483-1489 (2003).
Gordon et al., "Vapor Deposition of Metal Oxides and Silicates: Possible Gate Insulators for Future Microelectronics," *Chem. Mater.* 13: 2463-2464 (2001).
Min et al., "$Bi_{1-x-y}Ti_xSi_yO_z$ (BTSO) Thin Films for Dynamic Random Access Memory Capacitor Applications," *Chemical Vapor Deposition* 11(1): 38-43 (2005).
Schuisky et al., "Atomic Layer CVD in the Bi-Ti-O System," *Chemical Vapor Deposition* 6(3): 139-145 (2000).

(Continued)

*Primary Examiner*—Michael Cleveland
*Assistant Examiner*—Joel G Horning
(74) *Attorney, Agent, or Firm*—Knobbe Martens Olson & Bear LLP

(57) ABSTRACT

Processes are provided for producing bismuth-containing oxide thin films by atomic layer deposition. In preferred embodiments an organic bismuth compound having at least one monodentate alkoxide ligand is used as a bismuth source material. Bismuth-containing oxide thin films can be used, for example, as ferroelectric or dielectric materials in integrated circuits and as superconductor materials.

38 Claims, 2 Drawing Sheets

OTHER PUBLICATIONS

Shin et al., "Plasma-Enhanced Atomic Layer Deposition of $SrTa_2O_6$ and $SrBi_2Ta_2O_9$ Thin Films," Atomic Layer Deposition (ALD 2002) Conference, Hanyang University, Seoul, Korea, Aug. 19-21, pp. 1-18 (2002).

Suntola, "Atomic Layer Epitaxy," *Handbook of Crystal Growth*, vol. 3, chapter 14, pp. 601-663 (1994).

Williams et al., "Crystal Structure of $Bi(OCMe_2CH_2OMe)_3$ and Its Use in the MOCVD of $Bi_2O_3$," *Chemical Vapor Deposition* 7(5): 205-209 (2001).

* cited by examiner

PROCESS FOR PRODUCING OXIDE FILMS

BACKGROUND OF THE INVENTION

1. Field of the Invention

The invention relates generally to bismuth-containing oxide films. In particular embodiments, the present invention concerns novel processes for manufacturing bismuth-containing oxide thin films by atomic layer deposition.

2. Description of the Related Art

Bismuth is a component of several technologically important binary and multicomponent oxide thin film materials, particularly the ferroelectric oxides $Bi_4Ti_3O_{12}$, $(Bi,La)_4Ti_3O_{12}$, $BiFeO_3$ and $SrBi_2Ta_2O_9$, and the superconducting oxide $Bi_2Sr_2CaCu_2O_{8+x}$. The ferroelectric bismuth oxide films have great potential for use in ferroelectric memories. Such memory devices are likely to be provided with capacitors in the form of 3-D structures, which means that good conformality of the ferroelectric film will be important for proper function of the memory.

Atomic layer deposition ("ALD") refers generally to vapour deposition-type methods in which a material, typically a thin film, is deposited on a substrate from vapour phase reactants. ALD is based on sequential self-saturating surface reactions. ALD is described in detail in U.S. Pat. Nos. 4,058,430 and 5,711,811, incorporated herein by reference.

According to the principles of the ALD, the source chemicals (also known as "reactants" or "precursors") are separated from each other, such as by inert gas, to prevent gas-phase reactions and to enable the above-mentioned self-saturating surface reactions. Surplus source chemicals and reaction by-products, if any, are removed from the reaction chamber before the next source chemical is introduced into the chamber. Undesired gaseous molecules can be effectively expelled from the reaction chamber, for example, by keeping the gas flow speeds high with the help of an inert purging gas. The purging gas can be used to push the extra molecules towards a vacuum pump, which is also used for maintaining a suitable pressure in the reaction chamber. ALD provides controlled film growth as well as outstanding conformality.

Based on its general properties, ALD is a potentially attractive alternative for deposition of bismuth-containing oxide thin films. The main problem in the art has been finding appropriate bismuth—oxygen source chemical combinations for depositing bismuth oxide.

SUMMARY OF THE INVENTION

In one aspect, the present invention provides atomic layer deposition (ALD) type processes for producing bismuth-containing oxide thin films. Preferably organic bismuth compounds comprising at least one monodentate alkoxide ligand are used as the bismuth source material. In some embodiments, the organic bismuth compound comprises at least two bismuth atoms connected to each other via an oxygen bridge atom.

In some embodiments, binary and multicomponent oxide thin films containing bismuth and one or more additional metals are deposited.

In preferred embodiments, vapor phase pulses of an organic bismuth source material having at least one monodentate alkoxide ligand and at least one oxygen source material capable of forming an oxide with the bismuth source material are alternately and sequentially fed into a reaction space containing a suitable substrate. In some embodiments the oxygen source material is selected from the group consisting of water, oxygen, hydrogen peroxide, aqueous solution of hydrogen peroxide, ozone, oxides of nitrogen, halide-oxygen compounds, peracids (—O—O—H), alcohols, alkoxides, oxygen-containing radicals, oxygen-containing plasma and mixtures thereof. In some embodiments, an oxygen source material other than water is used.

In some embodiments, vapour phase pulses of additional source materials are include in the ALD process to produce ternary and other multicomponent bismuth oxide films. In some preferred embodiments pulses of a second metal source material are included in the ALD process. The second metal source material preferably comprises at least one transition metal or metal of groups 1 through 14 of the periodic table.

In some embodiments, the bismuth containing oxide thin films are annealed at a temperature of about 400° C. or greater, more preferably about at temperatures at about 600° C. or greater and yet more preferably at about 800° C. or greater.

DETAILED DESCRIPTION OF THE PREFERRED EMBODIMENT

Figure 1:
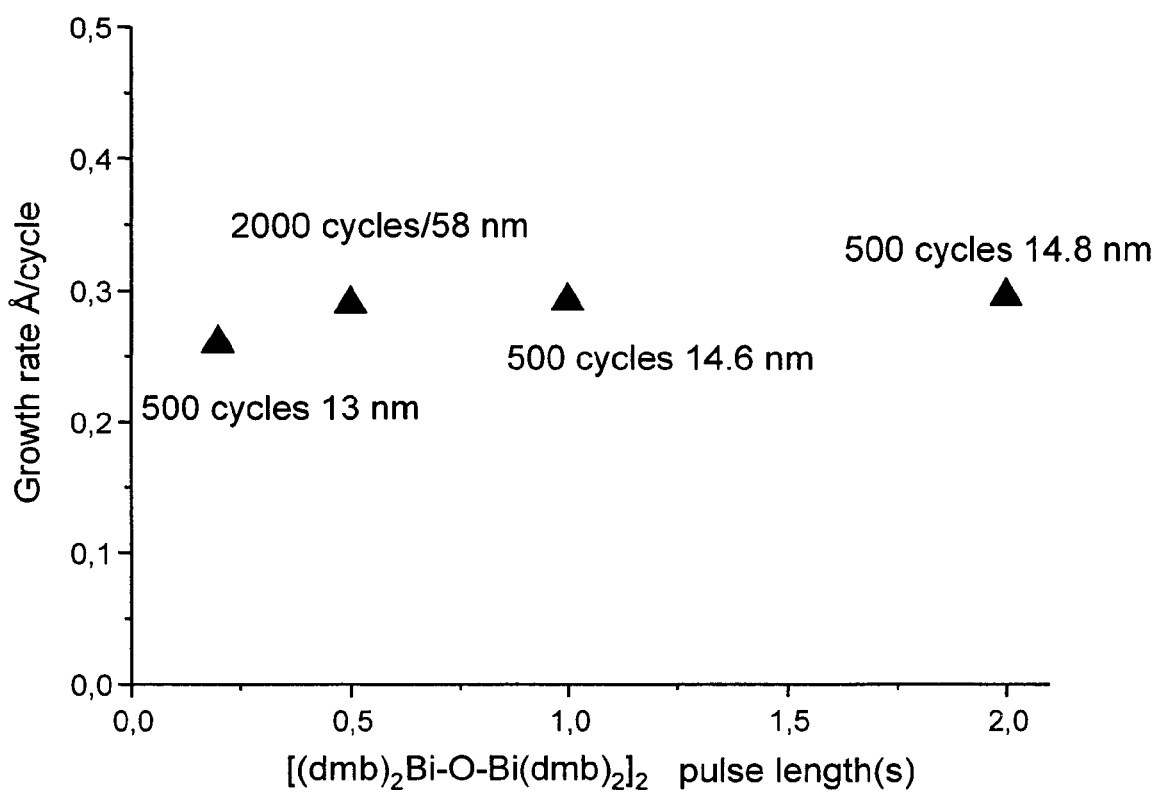
FIG. 1 shows the growth rate of $[(dmb)_2Bi—O—Bi(dmb)_2]_2 + H_2O$ ALD process at 240° C.

It has been found that a specific group of metal-organic bismuth compounds can be used as precursors for producing bismuth-containing oxide thin films by ALD. These include binary films, as well as multicomponent films. The organic bismuth compounds preferably contain monodentate alkoxide ligands. Advantageously the organic bismuth compounds are more stable across a wider temperature range than silylamino ligand-containing compounds, making it possible to deposit thin films by ALD at high temperatures without silicon incorporation. In addition, oxygen sources other than water can be used to form bismuth-containing oxide thin films.

Although the properties of the monodentate alkoxide precursors are illustrated below by the dimeric monodentate alkoxide precursor, the skilled artisan will appreciate that other monodentate alkoxide precursors can be used in the disclosed methods. $[(dmb)_2Bi—O—Bi(dmb)_2]_2$ (dmb=2,3-dimethyl-2-butoxy) is a volatile compound and contains purely organic ligands. At higher temperatures, the structure of the compound in vapour phase is believed to be monomeric: $(dmb)_2Bi—O—Bi(dmb)_2$. $[(dmb)_2Bi—O—Bi(dmb)_2]_2$ has been tested and found to work well as a precursor for depositing both binary and multicomponent oxides of bismuth by ALD, as described in more detail below.

Films deposited by the methods disclosed herein exhibit good thin films properties and have excellent conformality, even on complicated structures. As a result, the methods are applicable to a wide variety of applications, including formation of 3-D capacitors. Other applications for bismuth-containing oxide thin films deposited by the disclosed methods include use as ferroelectric or dielectric material in integrated circuits, superconductor materials, fuel cell materials and as catalysts. Other applications will be apparent to the skilled artisan.

Next, the invention will be described in detail with the aid of the following detailed description and by reference to the attached drawings.

In context of the present invention, "an ALD type process" generally refers to a process for depositing thin films on a substrate molecular layer by molecular layer using self-saturating chemical reactions on heated substrate surface. In the process, gaseous reactants are conducted alternately and sequentially into a reaction chamber of an ALD type reactor and contacted with a substrate located in the chamber to provide a surface reaction. Typically, a pulse of a first reactant is provided to the reaction chamber where it chemisorbs to the substrate surface in a self-limiting manner. Excess first reactant is then removed and a pulse of a second reactant is provided to the reaction chamber. The second reactant reacts with the adsorbed first reactant, also in a self-limiting manner. Excess second reactant and reaction by-products, if any, are removed from the reaction chamber. Additional reactants may be supplied in each ALD cycle, depending on the composition of the thin film being deposited.

The pressure and the temperature of the reaction chamber are adjusted to a range where physisorption (i.e. condensation of gases) and thermal decomposition of the precursors are avoided. Consequently, only up to one monolayer (i.e. an atomic layer or a molecular layer) of material is deposited at a time during each pulsing cycle. The actual growth rate of the thin film, which is typically presented as Å/pulsing cycle, depends, for example, on the number of available reactive surface sites on the surface and bulkiness of the reactant molecules.

In ALD processes, gas phase reactions between precursors and any undesired reactions with by-products are preferably inhibited or prevented. Precursor pulses are separated from each other by time and the reaction chamber is purged with an inactive gas (e.g. nitrogen or argon) and/or evacuated between reactant pulses to remove surplus gaseous reactants and reaction by-products from the chamber. The principles of ALD type processes have been presented by the inventor of the ALD technology, Dr T. Suntola, e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference.

An extensive description of ALD precursors and ALD-grown materials has been presented by Prof. M. Ritala and Prof. M. Leskelä in a recent review article, Handbook of Thin Film Materials, Vol. 1: Deposition and Processing of Thin Films, Chapter 2 "Atomic Layer Deposition", pp. 103-159, Academic Press 2002, which is incorporated herein by reference.

In the context of the present application "a reaction space" designates generally a reactor or a reaction chamber, or a defined volume therein, in which the conditions can be adjusted so that deposition of a thin film on a substrate is possible.

An "ALD type reactor" is a reactor where the reaction space is in fluid communication with at least one, preferably at least two precursor sources such that the precursors can be pulsed into the reactions space. The reaction space is also preferably in fluid communication with an inert gas source and a vacuum generator (e.g. a vacuum pump). The temperature and pressure of the reaction space and the flow rates of gases can be adjusted to a range that makes it possible to grow thin films by ALD type processes.

As is well known in the art, there are a number of variations of the basic ALD method, including PEALD (plasma enhanced ALD) in which plasma is used for activating reactants. Conventional ALD or thermal ALD refers to an ALD method where plasma is not used, but where the substrate temperature is high enough for overcoming the energy barrier (activation energy) during collisions between the chemisorbed species on the surface and reactant molecules in the gas phase so that up to a molecular layer of thin film grows on the substrate surface during each ALD pulsing sequence or cycle. For the purpose of the present invention, the term "ALD" covers both PEALD and thermal ALD.

"Metal source material," and "metal precursor" are used interchangeably to designate a volatile or gaseous metal compound that can be used in an ALD process to provide metal to the growing thin film. Preferred "metal source materials" and "metal precursors" can be used as a starting compound for deposition of the corresponding metal oxide.

The term "multicomponent oxide" covers oxide materials comprising at least two different metal cations.

Bismuth precursors comprising at least one, preferably from about 1 to 12, monodentate alkoxide ligands are preferably used as metal source materials in depositing bismuth containing thin films by ALD. Bismuth precursors which have a structure $BiL_3$, where L is alkoxide ligand, preferably comprise 1-4 alkoxide ligands, more preferably 3 alkoxide ligands. Most preferably said alkoxide ligands are monodentate alkoxide ligands. Bismuth precursors, which have an oxygen bridge between two bismuth atoms preferably contain 3-6 alkoxide ligands, more preferably 4 alkoxide ligands when in monomeric form, and preferably contain, 6-12 alkoxide ligands, more preferably 8 alkoxide ligands when in dimeric form.

Bismuth precursors comprising monodentate alkoxide ligands are exemplified by $Bi(alkoxy)_3$, $[(alkoxy)_2Bi\text{—}O\text{—}Bi(alkoxy)_2]_2$ and $(alkoxy)_2Bi\text{—}O\text{—}Bi(alkoxy)_2$, wherein the term "alkoxy" stands for a alkoxide group, preferably selected from substituted or unsubstitued methoxy, ethoxy, n- and i-propoxy, and n-, sec- and t-butoxy and different pentoxides. Possible substitutes can be chosen from, but are not limited to, the group of methyl, ethyl, n-propyl, i-propyl, n-butyl, sec-butyl and t-butyl. Further, one alkoxide ligand can comprise one or more substituents, as in case of 2,3-dimethyl-2-butoxy.

In each alkoxide ligand, and in different ligands, the alkyl groups may be the same or different. Preferably the said monodentate alkoxide ligand contains one oxygen atom. More preferably there is only one oxygen atom per one alkoxide ligand. Most preferably the oxygen atom of the alkoxide ligand is bonded to the bismuth atom in the precursor. In precursors that have structures with an oxygen bridge atom between the bismuth atoms, there are preferably 2-8, more preferably 2-4 bismuth atoms and 1-4, more preferably 1-2, oxygen atoms, depending on whether the precursor compound is in monomeric or in dimeric form. Trimeric or polymeric forms of the precursors can also be used. The skilled artisan will recognize that precursors might change during heating, for example from a dimeric solid state phase structure to a monomeric gaseous phase structure.

The general formula for the monodentate alkoxide ligands can be written as follows (Formula I):

$$\text{—O—}R^1R^2R^3 \qquad (I)$$

wherein each $R^1$, $R^2$, $R^3$ is independently selected from hydrogen; linear and branched $C_1$-$C_{20}$ alkyl, alkenyl and alkynyl groups, which independently are substituted or unsubstituted; and carbocyclic groups, such as aryl, preferably phenyl, cyclopentadienyl, alkylaryl, and halogenated carbocyclic groups; and heterocyclic groups.

In some embodiments, the precursors preferably comprise at least one ligand having the above Formula I. Generally, the number of ligands can vary between 1 and the valence of bismuth, viz. 3.

The general formula for the solid state structure of monodentate bismuth alkoxide compounds having oxygen bridges between bismuth atoms can be written as follows (Formula II):

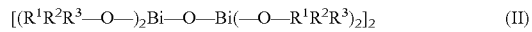

$$[(R^1R^2R^3{-}O{-})_2Bi{-}O{-}Bi({-}O{-}R^1R^2R^3)_2]_2 \qquad (II)$$

wherein each $R^1$, $R^2$, $R^3$ is independently selected from hydrogen; linear and branched $C_1C_{20}$ alkyl, alkenyl and alkynyl groups, which are independently substituted or unsubstituted; carbocyclic groups, such as aryl, preferably phenyl, cyclopentadienyl, alkylaryl, and halogenated carbocyclic groups; and heterocyclic groups.

The above alkyl, alkenyl and alkynyl groups can be selected from any linear or branched alkyl, alkenyl and alkynyl groups which have 1 to 20 carbon atoms, preferably 1 to 10 carbon atoms, in particular 1 to 6 carbon atoms. Examples of such alkyl groups include methyl, ethyl, n- and i-propyl- n-, i- and t-butyl-, n- and isoamyl (n- and isopentyl), n- and isohexyl, and 2,3-dimethyl-2-butyl. Alkyl groups are preferred.

The $C_{1-20}$, preferably $C_{1-10}$, in particular $C_{1-6}$, alkenyl and alkynyl groups include the corresponding groups having a corresponding degree of unsaturation.

In the alkyl, alkenyl and alkynyl groups, one or more of the hydrogen atoms can be replaced with another atom or with a functional groups. Examples of substituents of these kinds include halogen derivatives, wherein at least one hydrogen atom has been replaced with a fluorine, chlorine, bromine or iodine atom to yield a halogenated alkyl, alkenyl or alkynyl group. Similarly, at least one hydrogen atom can be replaced with a functional group, such as a substituent selected from the group of —$NH_2$, —$SH_2$, and —OH.

In addition to alkyl, ligands containing carbocyclic structures, comprising 5 to 18 ring atoms. Aryls, e.g. phenyl groups ($C_6H_5$—), are preferred for use as alkoxide compounds in ALD. Also, halogenated alkoxide compounds, including fluorinated alkoxide compounds, are considered advantageous ALD reactants. In such fluorinated compounds at least one hydrogen atom has been replaced with a fluorine atom.

The heterocyclic groups mentioned above may contain generally 5 to 18 ring atoms, at least one atom being selected from oxygen, nitrogen and sulfur.

For steric reasons, when one of $R^1$, $R^2$ and $R^3$ stands for a carbocyclic or heterocyclic ring, the other substituents stand for a non-cyclic structure, such as hydrogen or another of the below mentioned optional substituents:

Although alkoxide compounds of bismuth are preferred as ALD reactants, versatile chemistry related to alkoxide molecules makes it possible to replace one or more alkoxide groups in the bismuth molecule with other substitutents. Bismuth alkoxide molecule having monodentate alkoxide ligands can also contain other ligands, such as, without limitation, hydrogen, hydroxyls, amines, fluorides, chlorides, bromides, iodides, alkyls like methyl, ethyl and propyl, carbocyclic groups such as aryl, preferably phenyl, cyclopentadienyl, alkylaryl, halogenated carbocyclic groups, amides, amidinates and mixtures thereof.

A specific example of a preferred bismuth precursors is $[(dmb)_2Bi{-}O{-}Bi(dmb)_2]_2$. Other suitable compounds include, for example and without limitation, tris(2,3-dimethyl-2-butyxy)bismuth(III), tris(tert-butoxy)bismuth(III) and tris(isopropoxy)bismuth(III).

Of the above mentioned precursors, particularly preferred precursors, such as the $[(alkoxy)_2Bi{-}O{-}Bi(alkoxy)_2]_2$ and tris(alkoxy)bismuth(III) compounds, are relatively stable up to about 400° C. and can generally be used in ALD processing at temperatures below about 500° C., more preferably below about 400° C. Thus, in some embodiments ALD reactions are carried out at temperatures from about 20 to 350° C., preferably from about 70 to 350° C., more preferably from about 200 to 300° C. and still more preferably from about 250 to 300° C.

In preferred embodiments, gas phase pulses of an evaporated alkoxide bismuth compound, as described above, are introduced into an ALD reactor, where they are contacted with a suitable substrate. The deposition can be carried out at normal pressure, but in preferred embodiments a reduced pressure is used, preferably about 0.01 to 20 mbar, more preferably about 0.1-5 mbar. The substrate temperature is preferably low enough to keep the bonds between thin film atoms intact and to prevent thermal decomposition of the gaseous reactants. On the other hand, the substrate temperature is high enough to keep the source materials in the gas phase, i.e., condensation of the gaseous reactants is avoided. Further, the temperature is preferably sufficiently high to provide the activation energy for the surface reaction. Optionally, an inactive gas is used as a carrier gas and/or a purge gas during deposition.

Under the conditions described above, the amount of metal reactant bound to the substrate surface will be determined by the nature of the surface. That is, once all available binding sites are occupied, no additional precursor is able to adsorb on the surface. Thus the reaction is "self-saturating".

The substrate can comprise various types of materials, and a single substrate may comprise multiple materials. Examples include, but are not limited to, silicon, silica, coated silicon, germanium, silicon-germanium alloys, gallium arsenide, copper metal, nickel, tungsten, molybdenum, titanium, tantalum, niobium, iron, zinc, tin, cobalt, noble and platinum metals group including silver, gold, platinum, palladium, rhodium, iridium and ruthenium, various nitrides, such as transition metal nitrides, e.g. tantalum nitride $TaN_x$, titanium nitride TiN, tungsten nitride $WN_x$, molybdenum nitride $MoN_x$, niobium nitride $NbN_x$, transition metal silicon nitrides, tantalum silicon nitride $TaSiN_x$, titanium silicon nitride $TiSiN_x$, tungsten silicon nitride $WSiN_x$, molybdenum silicon nitride $MoSiN_x$, niobium silicon nitride $NbSiN_x$ various carbides, such as transition metal carbides, e.g. tungsten carbide WC, tantalum carbide TaC, niobium carbide NbC, titanium carbide TiC, molybdenum carbide MoC and nitride carbides, e.g. tungsten nitride carbide $WN_xC_y$, or oxides selected from the group of Bi, Li, Na, K, Mg, Ca, Sr, Rb, Cs, Ba, Ni, Mn, Cu, Co, Ti, Ta, Zr, Hf, V, Nb, Cr, W, Mo, Sc, Y, Lu, La, Ce, Pr, Nd, Pm, Sm, Eu, Gd, Tb, Dy, Ho, Er, Tm, Yb, Fe, Zn, Sn, Sb, Cr, In, Cd, Ga, Ge, B, As, Al, Si, Ru, Rh, Pd, Ag, Re, Os, Ir, Pt, Au, Hg, Se, Te, S, P, N and/or Pb oxide(s) or mixtures thereof. In some embodiments, conductive oxides, such as $SnO_2$, ZnO, $IrO_2$, $SrRuO_3$ and $RuO_2$ are particularly preferred. Conventionally, the preceding thin film layer deposited will form the substrate surface for the next thin film. For both ferroelectric capacitor structures and superconductor applications, bismuth-containing thin films are generally deposited on appropriately patterned metal surfaces (electrodes).

In order to convert the adsorbed bismuth precursor into bismuth oxide, the reactor is purged with a purge gas comprising an inactive gas to remove excess bismuth precursor, and then a gas phase pulse of an oxygen source material is introduced into the reactor where it reacts with the adsorbed bismuth compound. As with chemisorption of the bismuth precursor, the reaction of the oxygen source material and the adsorbed bismuth precursor is self-limiting.

The oxygen source material is preferably selected from the group of water, oxygen, hydrogen peroxide, aqueous solution of hydrogen peroxide, ozone, oxides of nitrogen, halide-oxygen compounds, peracids (—O—O—H), alcohols, alkoxides, oxygen-containing radicals, oxygen-containing plasma and mixtures thereof. In some embodiments, an oxygen source material other than water is used.

By alternating the reactions of the bismuth precursor and the oxygen source material, a bismuth-containing oxide thin film is deposited. Typically, a growth rate of about 0.20 to 0.35 Å/cycle is achieved, usually about 0.29 Å/cycle.

In order to produce multicomponent oxide films, provision of a second (or additional) metal source material can be introduced into the ALD process. The second metal source material can be, for example, a metal compound or a complex metal compound comprising two or more metals. The metals are preferably selected from the group of volatile or gaseous compounds of transition metals and main group metals, i.e., elements of groups 1, 2, 3, 4, 5, 6, 7, 8, 9, 10, 11, 12, 13 and/or 14 (according to the system recommended by IUPAC) in the periodic table of elements.

Since the properties of metal compounds vary, the suitability of each metal compound can be determined by the skilled artisan through routine experimentation. The properties of various metal compounds can be found, e.g., in N. N. Greenwood and A. Earnshaw, *Chemistry of the Elements*, $1^{st}$ edition, Pergamon Press, 1986.

A preferred process for forming bismuth-containing multicomponent oxide thin films by atomic layer deposition on a substrate in a reaction space, comprises the general steps of alternately feeding into the reaction space vapour phase pulses of a first metal source material, a first oxygen source material capable of forming an oxide with the first metal source material, a second metal source material, and a second oxygen source material capable of forming an oxide with the second metal source material. The first metal source material is preferably an organic bismuth compound having at least one monodentate alkoxide ligand, and the second metal source material is preferably a volatile compound comprising at least one transition metal or main group metal of groups 1, 2, 3, 4, 5, 6, 7, 8, 9, 10, 11, 12, 13, and/or 14 in the periodic table of elements. The first and second oxygen source materials may be the same or different. Thus, the second metal source material can be oxidized using the same oxygen source material used to oxidize the first metal source material. However, in some embodiments a different oxygen source material is used to oxidize the second metal source material. Additional metal source materials and oxygen source materials can be utilized depending on the nature of the film to be deposited.

In some embodiments for depositing binary or other multicomponent films, the complete ALD process can be divided into two cycles, with a different metal oxide being deposited in each. In one cycle the first metal source material and the first oxygen source material are alternately supplied. In the second cycle, the second metal source material and second oxygen source material are supplied. In some embodiments, the second cycle is included after each first cycle. However, in other embodiments, the first cycle is repeated two or more times for each second cycle or vice versa. That is, one of the cycles is introduced intermittently in the ALD process. Additional cycles can be included, depending on the desired composition of the film being deposited.

In some embodiments, nanolaminates comprising one or more layers of each metal oxide are formed. Thus, the first cycle is repeated a number of times until a metal oxide layer of the desired thickness is formed. The second cycle is then repeated to form a layer of a second metal oxide of the desired thickness. This process is repeated to form a laminate structure comprising alternating layers of two or more metal oxides. Additional cycles can be incorporated if layers of additional materials are to be included in the nanolaminate structure.

In other embodiments, a single oxygen containing reactant is utilized in depositing a multicomponent oxide thin film. For example, a first metal reactant can be provided, followed by a second metal reactant. An oxygen-containing reactant is then provided that oxidizes both the first and second metal reactants. In these embodiments the first and second metal reactants (and any additional metal reactants) can be provided in any order prior to provision of the oxygen containing reactant.

Suitable metal source materials can be found, for example, among halides, preferably fluorides, chlorides, bromides or iodides, or metal organic compounds, preferably alkoxy (cf. the titanium alkoxide of Example 4), alkylamino, alkyl, cyclopentadienyl, amidinate, dithiocarbamate or betadiketonate compounds of the desired metal(s). Also double metal precursors, i.e. molecules containing two metals in a discrete ratio, may be used (cf. Example 2 below).

In preferred embodiments, a multicomponent oxide film comprises Bi, Li, Na, K, Mg, Ca, Sr, Rb, Cs, Ba, Ni, Mn, Cu, Co, Ti, Ta, Zr, Hf, V, Nb, Cr, W, Mo, Sc, Y, Lu, La, Ce, Pr, Nd, Pm, Sm, Eu, Gd, Tb, Dy, Ho, Er, Tm, Yb, Fe, Zn, Sn, Sb, Cr, In, Cd, Ga, Ge, B, As, Al, Si, Ru, Rh, Pd, Ag, Re, Os, Ir, Pt, Au, Hg, Se, Te, S, P, N and/or Pb oxide(s) and, thus, the corresponding gaseous or volatile compounds are preferably used as reactants.

Aluminium and silicon are particularly interesting as sources of a second and/or third metal in ternary and other multicomponent bismuth-containing oxides. In some embodiments, multicomponent Bi/Al and/or Si oxides are deposited and can be used, for example, as high-k dielectric materials.

According to one preferred embodiment, a multicomponent film is produced by contacting a substrate with alternating pulses of the two or more metal precursors and oxygen source chemicals in two or more cycles as described above. This embodiment based is based on "mixing cycles." Typically, the ratio of cycles comprising pulses of bismuth-containing precursor followed by oxygen source pulses to cycles comprising pulses of a second metal source followed by the corresponding oxygen source pulses is from about 100:1 to 1:100, preferably from about 20:1 to 1:20, most preferably from about 10:1 to 1:10. In particular embodiments a ratio of from about 6:1 to 1:3 is used. In more particular embodiments the second metal source is $Ti(OMe)_4$ and the ratio is from about 3:1 to 2:1. The ratio of cycles may depend on the molecular size of the metal source precursors.

A stoichiometric surplus of from 1 to 20 at-% of bismuth in the films is advantageous for some applications. In particular, in some embodiments compounds having essentially the formula $SrBi_2Ta_2O_9$ (SBT), $(Bi,La)_4Ti_3O_{12}$, or $Bi_2Sr_2CaCu_2O_{8+x}$ are deposited. An example for deposition of $SrBi_2Ta_2O_9$ (SBT) is given in Example 3 below.

Preferably, films are annealed after the ALD deposition. In some embodiments, annealing provides ferroelectric phases. According to some preferred embodiments, multicomponent films are prepared by depositing a multicomponent oxide film by mixing ALD cycles at a particular ratio or by depositing laminar layers of two or metal oxides as described above. The deposited films are annealed at increased temperatures to provide a ferroelectric phase. In this way, an amorphous structure is provided and the ferroelectric or superconducting phase can be obtained by annealing in the presence of oxygen (such as in the presence of air) at temperatures above 400° C., preferably from about 500 to 1100° C., more preferably from about 600 to 900° C. and still more preferably from about 600 to 800° C. However, in some cases an annealing temperature from 800-2000° C. can be used. For example, these high temperatures might be used to produce superconductors. The composition of the films can be controlled by adjusting the thickness of the laminar layers. One embodiment is illustrated in Example 4 below.

Other embodiments for preparing binary films comprise a combination of the above described embodiments. Thus, the cycle mixing approach can be used, for example, for producing a mixed bismuth-titanium, bismuth-tantalum or bismuth-hafnium oxide film. If the film is amorphous, it can be annealed at the temperatures mentioned above, in the presence of air or another oxygen-containing gas or at inert atmosphere, such as nitrogen or argon atmosphere. A hydrogen containing atmosphere can also be used for annealing.

Preferred multicomponent oxide thin films of bismuth include, but are not limited to, $SrBi_oTa_pO_q$, $(Bi,La)_oTi_pO_m$, $BiTi_pO_m$, $BiTa_oO_m$, $BiFe_oO_m$ and $BiSr_oCa_pCu_qO_m$, wherein o, p and q are integers which can be independently selected from 0-20 and m is an integer which can be selected from 0-100. Preferably o, p and q can be independently selected from 1-10 and m can be selected from 1-50, more preferably from 1-20. More preferably o, p and q can be independently selected from 1-5 and m can be selected from 1-15. The person of ordinary skill in the art will recognize that different stoichiometric relationships are possible and can select o, p and q outside the presented ranges, if desired.

In some embodiments, preferred multicomponent bismuth compounds have essentially the formula of about $SrBi_2Ta_2O_9$ (SBT), $(Bi,La)_4Ti_3O_{12}$, $Bi_4Ti_3O_{12}$, $Bi_3Ta_2O_9$, $BiFeO_3$ or $Bi_2Sr_2CaCu_2O_{8+x}$ before or after the annealing step. Bismuth oxide can be used also as mixed to compounds like $SrTiO_3$, $BaTiO_3$, $BaSrTiO_3$, $PbTiO_3$, $PbZrTiO_3$ and $Pb(La,Zr)TiO_x$. The above-mentioned examples do not restrict the use of bismuth oxide mixed also with other compounds.

The present novel thin film oxide materials will find extensive application, for example, in the semiconductor industry particularly in applications where ferroelectric materials are used, such as for non-volatile memories. Bi-containing superconductor films can be used, for example, in the superconductor device industry. Other applications will be apparent to the skilled artisan.

The following non-limiting examples illustrate some preferred embodiments of the invention. They were carried out in an F-120™ ALD reactor supplied by ASM Microchemistry Oy (Espoo, Finland).

EXAMPLE 1

ALD Growth of $Bi_2O_3$ from $[(dmb)_2Bi—O—Bi(dmb)_2]_2$ and $H_2O$ was carried out at 240° C. with different pulse lengths of $[(dmb)_2Bi—O—Bi(dmb)_2]_2$. At 240° C. the $Bi_2O_3$ growth rate saturates at about 0.29-0.30 Å/cycle (FIG. 1).

EXAMPLE 2

Figure 2:
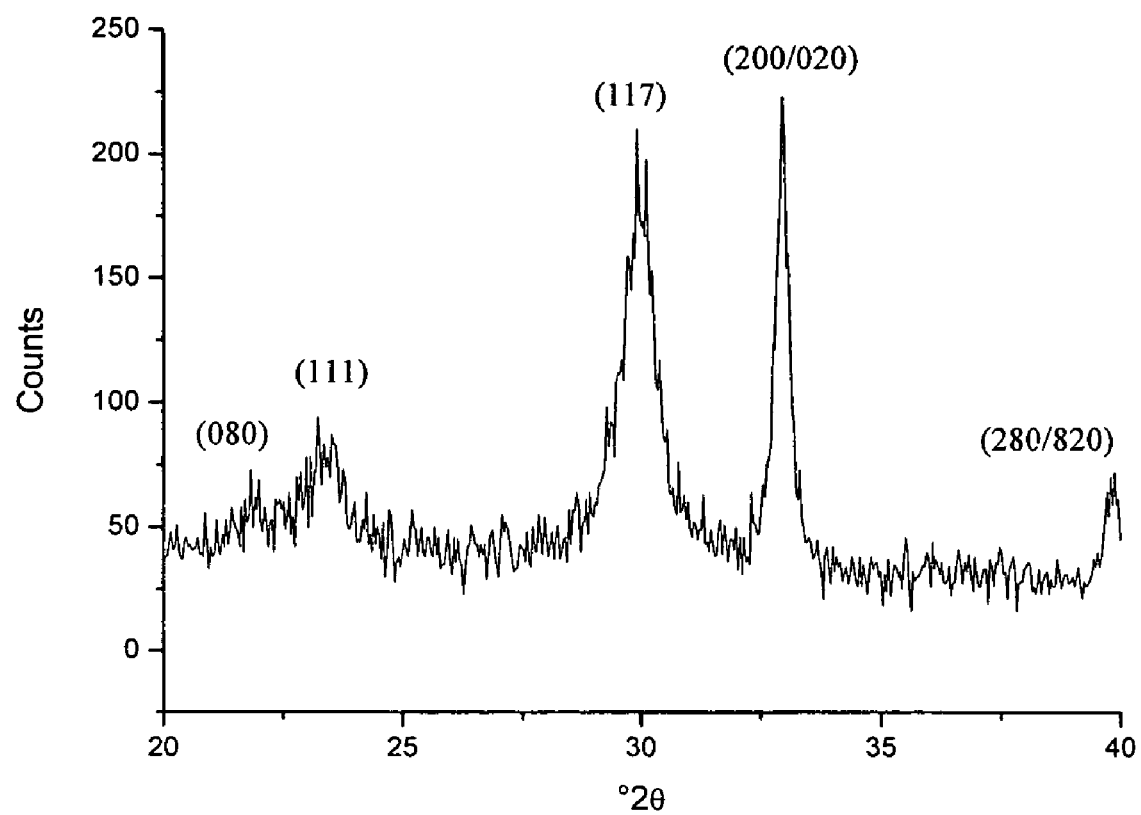
FIG. 2 shows Grazing Incidence X-ray Diffraction (GIXRD) pattern of Bi—Ti—O film annealed in $O_2$ at 700° C. for 60 seconds. The peak indices refer to the orthorhombic $Bi_4Ti_3O_{12}$ phase (PDF card 35-0795).

$BiTi_oO_m$ were deposited at 240° C. by mixing $[(dmb)_2Bi—O—Bi(dmb)_2]_2—H_2O$ and $Ti(OMe)_4—H_2O$ cycles with pulsing ratio of 3:1 (Bi-precursor—$H_2O$ cycles:Ti-precursor—$H_2O$ cycles). The Bi/Ti elemental ratio in the deposited film was 1.47 as measured with Energy Dispersive X-Ray Spectroscopy (EDS). $Bi_4Ti_3O_{12}$, an orthorombic ferroelectric phase, was observed after annealing as-deposited films in air at 700° C. (FIG. 2).

If some other precursor than $Ti(OMe)_4$ will be used, the cycle ratio may need adjustments, because larger molecules, like $Ti(O^iPr)_4$ may need more cycles to produce film with same Bi/Ti elemental ratio.

EXAMPLE 3

$SrBi_2Ta_2O_9$ films can be deposited at 240° C. by mixing $[(dmb)_2Bi—O—Bi(dmb)_2]_2—H_2O$, $Ta(OEt)_5—H_2O$ cycles and $Sr(^iPrCp)_3$ or $Sr(^tBuCp)_3—H_2O$ cycles with ratios of approximately from 1:1:1 to 2:1:1 (Bi:Sr:Ta). $SrBi_2Ta_2O_9$, A ferroelectric phase, can be observed after annealing as-deposited films in air at about from 600-800° C.

EXAMPLE 4

A second approach can be also used for depositing $SrBi_2Ta_2O_9$ by mixing $[(dmb)_2Bi—O—Bi(dmb)_2]_2—H_2O$ and $SrTa_2(OEt)_{10}(dmae)_2—H_2O$ cycles. Thus, amorphous laminate layers of Sr—Ta—O and Bi—O can be grown. In this case, the overall composition can be adjusted by varying the thicknesses of these layers, and the desired compound was formed by reacting the layers with each other in the following annealing steps. All the as-deposited SBT films are probably amorphous, but after annealing in air at 750° C. the desired ferroelectric phase can be observed.

It will be appreciated by those skilled in the art that various omissions, additions and modifications may be made to the processes described above without departing from the scope of the invention, and all such modifications and changes are intended to fall within the scope of the invention, as defined by the appended claims.

What is claimed is:

1. A process for depositing bismuth-containing oxide thin films on a substrate in a reaction space by atomic layer deposition, comprising contacting the substrate with a first metal reactant, wherein the first metal reactant is an organic bismuth compound having at least one monodentate alkoxide ligand and at least two bismuth atoms connected to each other via an oxygen bridge atom.

2. The process according to claim 1, wherein the organic bismuth compound comprises from 1 to 12 alkoxide ligands having Formula I:

$$—O—R^1R^2R^3 \quad \quad (I)$$

in which each $R^1$, $R^2$, and $R^3$ is independently selected from hydrogen, unsubstituted linear and branched $C_1$-$C_{20}$ alkyl, alkenyl and alkynyl groups, substituted linear and branched $C_1$-$C_{20}$ alkyl, alkenyl and alkynyl groups, carbocyclic groups, and heterocyclic groups.

3. The process according to claim 2, wherein the carbocyclic group is selected from aryl, cyclopentadienyl, alkylaryl and halogenated carbocyclic groups.

4. The process according to claim 2, wherein at least one of the substituted linear or branched $C_1$-$C_{20}$ alkyl, alkenyl and alkynyl groups is substituted by a substituent selected from the group of halogen, amino, thio and hydroxyl.

5. The process according to claim 1, wherein the organic bismuth compound is a compound according to Formula II

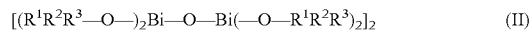

$$[(R^1R^2R^3—O—)_2Bi—O—Bi(—O—R^1R^2R^3)_2]_2 \quad \quad (II)$$

in which each $R^1$, $R^2$, and $R^3$ is independently selected from hydrogen, unsubstituted linear and branched $C_1$-$C_{20}$ alkyl, alkenyl and alkynyl groups, substituted linear and branched $C_1$-$C_{20}$ alkyl, alkenyl and alkynyl groups, carbocyclic groups and heterocyclic groups.

6. The process according to claim 1, wherein the organic bismuth compound is $[(dmb)_2Bi$—O—$Bi(dmb)_2]_2$ in which dmb is 2,3-dimethyl-2-butoxy.

7. The process according to claim 1, comprising alternately feeding into the reaction space vapor phase pulses of the organic bismuth compound and at least one oxygen source material.

8. The process according to claim 1, wherein the bismuth-containing oxide thin film is a ternary oxide thin film.

9. The process according to claim 8, wherein the ternary oxide thin film comprises a metal selected from the group of copper, cobalt, nickel, iron, titanium, tantalum, hafnium, zirconium, calcium, barium, strontium, silicon and aluminium oxides.

10. The process according to claim 8, wherein the metal is provided by a second metal reactant selected from the group of halides and metal organic compounds.

11. The process according to claim 10, wherein the second source metal reactant is selected from the group of alkoxy, alkylamino, cyclopentadienyl, dithiocarbamate and betadiketonate compounds.

12. The process according to claim 10, wherein the second metal reactant is selected from the group of double metal precursors, wherein each molecule contains two metals in a discrete ratio.

13. The process according to claim 9, wherein the ternary oxide thin film comprises a compound having the formula $Bi_4Ti_3O_{12}$.

14. The process according to claim 9, wherein the ternary oxide thin film is annealed at a temperature above about 400° C.

15. The process according to claim 14, wherein the ternary oxide thin film is annealed at a temperatures from about 600 to about 800° C.

16. The process according to claim 1, wherein the bismuth-containing oxide thin film is a multicomponent oxide thin film.

17. The process according to claim 16, wherein the multicomponent oxide thin film comprises at least two metal oxides selected from the group of copper, cobalt, nickel, iron, titanium, tantalum, lanthanum, hafnium, zirconium, calcium, barium, strontium, silicon and aluminum oxides.

18. The process according to claim 17, wherein the multicomponent oxide thin film comprises a compound selected from compounds having the formula $SrBi_oTa_pO_q$, $(Bi,La)_oTi_pO_q$, $BiTi_pO_o$, $BiTa_oO_p$, $BiFe_oO_m$ and $BiSr_oCa_pCu_qO_m$, wherein o, p, q and m are integers which are independently selected from 1 to 20.

19. The process according to claim 16, wherein the multicomponent oxide thin film is annealed at a temperature over 400° C.

20. The process according to claim 19, wherein the multicomponent oxide thin film is annealed at a temperature from about 600° C. to 800° C.

21. The process according to claim 1, wherein the atomic layer deposition process is carried out at a deposition temperature of less than about 400° C.

22. The process according to claim 21, wherein the deposition temperature is in the range of about 200° C. to 300° C.

23. The process according to claim 1, wherein the oxygen source material is selected from the group of water, oxygen, hydrogen peroxide, aqueous solution of hydrogen peroxide, ozone, oxides of nitrogen, halide-oxygen compounds, peracids (—O—O—H), alcohols, alkoxides, oxygen-containing radicals, oxygen-containing plasma and mixtures thereof.

24. The process according to claim 23, wherein the oxygen source material is selected from the group of water and ozone.

25. A process for forming a bismuth-containing multicomponent oxide thin film on a substrate in a reaction space by atomic layer deposition, the process comprising alternately feeding into said reaction space vapour phase pulses of a first bismuth source material, a second metal source material, and at least one oxygen source material, wherein said first metal source material is an organic bismuth compound having at least one monodentate alkoxide ligand and at least two bismuth atoms connected to each other via an oxygen bridge atom, and said second metal source material is a volatile compound comprising at least one transition metal or at least one main group metal of groups 1, 2, 3, 4, 5, 6, 7, 8, 9, 10, 11, 12, 13, and/or 14 (according to the system recommended by IUPAC) in the periodic table of elements.

26. The process according to claim 25, wherein the process comprises a first cycle in which a pulse of the bismuth source material is followed by a pulse of a first oxygen source material and a second cycle in which a pulse of the second metal source material is followed by a pulse of a second oxygen source material.

27. The process according to claim 26, wherein the ratio of the first cycle to the second cycle is from about 10:1 to about 1:10.

28. The process according to claim 27, wherein the ratio of the first cycle to the second cycle is from 6:1 to 1:3.

29. The process according to claim 25, wherein the multicomponent film contains a stoichiometric surplus of 1 to 20 at-% of bismuth.

30. The process according to claim 25, comprising depositing laminar layers of bismuth oxide and another metal oxide and annealing the laminar layers together at increased temperatures to provide a ferroelectric phase.

31. The process according to claim 25, comprising preparing a ternary oxide film by contacting the substrate with the bismuth precursor and the second metal precursor, followed by the oxygen source.

32. The method of claim 31, additionally comprising annealing the resulting ternary oxide film in the presence of an oxygen-containing gas.

33. The process according to claim 25, wherein the multicomponent oxide thin film is selected from the group of $SrBi_oTa_pO_q$, $(Bi,La)_oTi_pO_q$, $BiTi_pO_o$, $BiTa_oO_p$, $BiFe_oO_m$ and $BiSr_oCa_pCu_qO_m$, wherein o, p and q are integers which can be independently selected from 1-5 and m can be selected from 1-15.

34. The process according to claim 25, additionally comprising annealing the deposited film.

35. The process of claim 34, wherein after annealing the multicomponent oxide film is selected from the group of $SrBi_2Ta_2O_9$ (SBT), $(Bi,La)_4Ti_3O_{12}$, $Bi_4Ti_3O_{12}$, $Bi_3Ta_2O_9$, $BiFeO_3$ or $Bi_2Sr_2CaCu_2O_{8+x}$.

36. The process according to claim 34, wherein the multicomponent oxide film has ferroelectric phases after annealing.

37. The process according to claim 34, wherein the multicomponent oxide thin film is annealed at a temperature over about 400° C.

38. The process according to claim 34, wherein the multicomponent oxide thin film is annealed at a temperature from about 600 to 800° C.

* * * * *